(12) United States Patent
Takagi et al.

(10) Patent No.: US 10,116,266 B2
(45) Date of Patent: Oct. 30, 2018

(54) DOHERTY AMPLIFIER

(71) Applicant: KABUSHIKI KAISHA TOSHIBA, Minato-ku (JP)

(72) Inventors: Kazutaka Takagi, Kawasaki (JP); Naotaka Tomita, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/438,252

(22) Filed: Feb. 21, 2017

(65) Prior Publication Data
US 2017/0163221 A1    Jun. 8, 2017

Related U.S. Application Data

(63) Continuation-in-part of application No. 14/969,475, filed on Dec. 15, 2015.

(30) Foreign Application Priority Data

Jan. 9, 2015   (JP) ................................ 2015-003565

(51) Int. Cl.
*H03F 1/02* (2006.01)
*H03F 3/21* (2006.01)
(Continued)

(52) U.S. Cl.
CPC ............. *H03F 1/0288* (2013.01); *H03F 1/42* (2013.01); *H03F 1/565* (2013.01); *H03F 3/211* (2013.01);
(Continued)

(58) Field of Classification Search
USPC .................... 330/295, 124 R, 84, 286, 53–54
See application file for complete search history.

(56) References Cited

U.S. PATENT DOCUMENTS 6,262,629 B1   7/2001   Stengel et al.
7,602,241 B2   10/2009   Suzuki et al.
(Continued)

FOREIGN PATENT DOCUMENTS

JP   2001-185966   7/2001
JP   2008-5321 A   1/2008
(Continued)

OTHER PUBLICATIONS

Extended European Search Report dated Jun. 2, 2016 in Patent Application No. 15201129.2.
(Continued)

*Primary Examiner* — Hieu Nguyen
(74) *Attorney, Agent, or Firm* — Oblon, McClelland, Maier & Neustadt, L.L.P.

(57) ABSTRACT

A Doherty amplifier of an embodiment includes an input terminal, an output terminal a splitter, a combiner, a carrier amplifier, a peak amplifier. The splitter is connected to the input terminal, the splitter having first and second outputs. The combiner is connected to the output terminal, the combiner having first and second inputs. The carrier amplifier includes a first input-side two-port network connected to the first output of the splitter, a first amplifier connected to an output of the first input-side two-port network, and a first output-side two-port network connected between an output of the first amplifier and the first input of the combiner. The peak amplifier includes a second input-side two-port network connected to the second output of the splitter, a second amplifier connected to the output of the second input-side two-port network, and a second output-side two-port network connected between an output of the second amplifier and the second input of the combiner. The combiner is a parallel-connected load type having a parallel connection of the output-side two-port network of the carrier amplifier and
(Continued)

the output-side two-port network of the peak amplifier for the output terminal at a combining point. The load admittance at the combining point is expressed using a complex number.

1 Claim, 8 Drawing Sheets

(51) Int. Cl.
*H03F 1/56* (2006.01)
*H03F 1/42* (2006.01)
*H03F 3/24* (2006.01)
*H03F 3/60* (2006.01)

(52) U.S. Cl.
CPC ............. *H03F 3/245* (2013.01); *H03F 3/604* (2013.01); *H03F 2200/09* (2013.01); *H03F 2200/111* (2013.01); *H03F 2200/391* (2013.01); *H03F 2200/451* (2013.01); *H03F 2200/543* (2013.01); *H03F 2200/75* (2013.01); *H03F 2203/21106* (2013.01)

(56) References Cited

U.S. PATENT DOCUMENTS

| | | | | |
|---|---|---|---|---|
| 8,198,938 | B2* | 6/2012 | Yu ........................ | H03F 1/0288 330/124 R |
| 8,975,855 | B2* | 3/2015 | Gerdes .................... | H02P 27/10 318/254.1 |
| 2008/0007331 | A1 | 1/2008 | Suzuki et al. | |
| 2012/0025915 | A1 | 2/2012 | Ui et al. | |
| 2014/0132343 | A1 | 5/2014 | Colantonio et al. | |
| 2016/0013761 | A1 | 1/2016 | Takenaka | |

FOREIGN PATENT DOCUMENTS

| | | |
|---|---|---|
| JP | 2009-165037 A | 7/2009 |
| JP | 2012-29239 | 2/2012 |
| JP | 2013-187553 | 9/2013 |
| JP | 2016-19228 A | 2/2016 |
| WO | WO 2012/175106 A1 | 12/2012 |
| WO | WO 2013/015778 A1 | 1/2013 |
| WO | WO 2014/089695 A1 | 6/2014 |

OTHER PUBLICATIONS

M. Hayati et al., "A broadband Doherty power amplifier with harmonic suppression", AEU International Journal of Electronics and Communication, vol. 68, No. 5, May 1, 2014, pp. 406-412.

Mohammadhassan Akbarpour et al., "A 60GHz CMOS class C Amplifier Intended for Use in Doherty Architecture", Wireless Information Technology and Systems (ICWITS), 2012 IEEE International Conference on, IEEE, Nov. 11, 2012, pp. 1-4.

W.H. Dohetry, "A New High Efficiency Power Amplifier for Modulated Waves", Proceedings of the Institute of Radio Engineers, vol. 24, No. 9, Sep. 1936, 20 pages.

Xiaohu H. Fang et al., "Extension of High-Efficiency Range of Doherty Amplifier by Using Complex Combining Load", IEEE Transactions on Microwave Theory and Techniques, vol. 62, No. 9, Sep. 2014, 10 pages.

Xiaohu Fang et al., "Broadband, Wide Efficiency Range, Doherty Amplifier Design Using Frequency-Varying Complex Combining Load", Department of Electronic Engineering, The Chinese University of Hong Kong, IEEE, 2015, 4 pages.

* cited by examiner

FIG. 4

|  | COMPARATIVE EXAMPLE | EMBODIMENT |
|---|---|---|
| $RL/Roptc$ | 4.000 | 4.000 |
| $\omega o \cdot Co \cdot Roptc$ | 1.300 | 1.300 |
| $\omega o \cdot L1/Roptc$ | 0.690 | 0.751 |
| $\omega o \cdot C1 \cdot Roptc$ | 1.089 | 4.774 |
| $\omega o \cdot L2/Roptc$ | 0.867 | 0.504 |
| $\omega o \cdot C2 \cdot Roptc$ | 1.455 | 3.260 |
| $Z1/Roptc$ | 0.838 | 0.398 |
| $l1/\lambda$ | 0.145 | 0.205 |
| $Z2/Roptc$ | 0.388 | 0.683 |
| $l2/\lambda$ | 0.250 | 0.091 |
| $Z3/Roptc$ | 0.723 | 0.319 |
| $l3/\lambda$ | 0.250 | 0.169 |
| $Z4/Roptc$ | 1.838 | 0.894 |
| $l4/\lambda$ | 0.250 | 0.323 |
| $Z5/Roptc$ | 3.424 | 2.502 |
| $l5/\lambda$ | 0.250 | 0.272 |

DOHERTY AMPLIFIER

CROSS-REFERENCE TO RELATED APPLICATION

This application is a continuation-in-part application of U.S. application Ser. No. 14/969,475 filed Dec. 15, 2015, which is based upon and claims the benefit of priority from Japanese Patent Application No. 2015-003565, filed Jan. 9, 2015, the entire contents of which are incorporated herein by reference.

FIELD

Embodiments described herein relate generally to a Doherty amplifier.

BACKGROUND

In a system such as quadrature amplitude modulation, which uses a modulation signal having a high peak power with respect to an average power, although meeting specifications for distortion requires sufficient back-off for the amplifier, if the back-off is large in general amplifiers such as class AB amplifiers, the efficiency is reduced. Given this, the Doherty amplifier has been known as an amplifier having high efficiency at a large back-off.

The Doherty amplifier includes a carrier amplifier and a peak amplifier connected in parallel and outputs a signal that is the combining of the high frequency signals amplified by the carrier amplifier and the peak amplifier. By having an impedance inverting circuit (IIN: impedance inverting network), the Doherty amplifier achieves a high efficiency when there is a back-off.

There are two types of Doherty amplifiers which are parallel-connected load type and series-connected load type amplifiers. An inverted Doherty amplifier has also been known as a Doherty amplifier. The inverted Doherty amplifier is a parallel-connected load type having an odd number of IINs on the output side of the carrier amplifier and an even number of IINs on the output side of the peak amplifier. An amplifier that integrates a Doherty amplifier and an inverted Doherty amplifier has been conventionally known.

In this Doherty amplifier, however, because the load admittance or load impedance is a pure conductance or pure resistance, although the efficiency is high at a specific frequency, there has been a possibility of the efficiency decreasing away from that specific frequency.

BRIEF DESCRIPTION OF THE DRAWINGS

FIG. 4 shows the setting of the circuit elements included in the parallel-connected load type Doherty amplifier in the embodiment.

Figure 1:
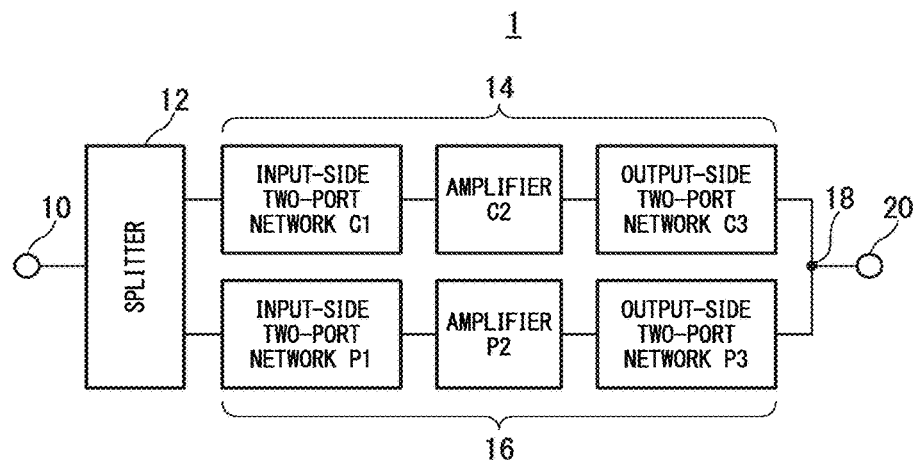
FIG. 1 is a block diagram showing the parallel-connected load type constitution of a Doherty amplifier as an embodiment.

Some embodiments are directed to a Doherty amplifier. The Doherty amplifier may include, but is not limited to, an input terminal, an output terminal a splitter, a combiner, a carrier amplifier, a peak amplifier. The splitter is connected to the input terminal, and the splitter having first and second outputs. The combiner is connected to the output terminal, and the combiner having first and second inputs. The carrier amplifier includes a first input-side two-port network connected to the first output of the splitter, a first amplifier connected to an output of the first input-side two-port network, and a first output-side two-port network connected between an output of the first amplifier and the first input of the combiner. The peak amplifier includes a second input-side two-port network connected to the second output of the splitter, a second amplifier connected to the output of the second input-side two-port network, and a second output-side two-port network connected between an output of the second amplifier and the second input of the combiner. The combiner is a parallel-connected load type having a parallel connection of the output-side two-port network of the carrier amplifier and the output-side two-port network of the peak amplifier for the output terminal at a combining point. The load admittance at the combining point is expressed using a complex number.

In some embodiments, if the load admittance at the combining point is $YL'$, the circuit parameters of the output-side two-port network from the current source end of the carrier amplifier up to the combining point are Fc (Ac, Bc, Cc, Dc), the circuit parameters of the output-side two-port network from the current source end of the peak amplifier up to the combining point are Fp (Ap, Bp, Cp, Dp), the load resistance of the carrier amplifier in the state in which it is not backed off is Roptc, the load resistance of the peak amplifier in the state in which it is not backed off is Roptp, $m=1+Roptc/Roptp$, and the phase difference between the phase of the current source of the carrier amplifier and the phase of the current source of the peak amplifier is $\theta$, within a transmission frequency band, the relationships:

$$(Ac \times Dp + Bc \times Cp + Bc \times Dp \times YL')/(Cc \times Dp + Cp \times Dc + Dc \times Dp \times YL') = m \times Roptc \qquad (1)$$

$$Ac/(Cc \times Dp + Cp \times Dc + Dc \times Dp \times YL') = -Roptc \times e^{j \times \theta} \qquad (2)$$

$$\Delta p/(Cc \times Dp + Cp \times Dc + Dc \times Dp \times YL') = Roptc \times e^{-j \times \theta}, \text{ and} \quad (3)$$

$$(Ap \times Dc + Bp \times Cc + Bp \times Dc \times YL')/(Cc \times Dp + Cp \times Dc + Dc \times Dp \times YL') = 0 \quad (4)$$

are satisfied, where $\Delta c = Ac \times Dc - Bc \times Cc$ and $\Delta p = Ap \times Dp - Bp \times Cp$.

Some embodiments are directed to a Doherty amplifier. The Doherty amplifier may include, but is not limited to, an input terminal, an output terminal a splitter, a combiner, a carrier amplifier, a peak amplifier. The splitter is connected to the input terminal, and the splitter having first and second outputs. The combiner is connected to the output terminal, and the combiner having first and second inputs. The carrier amplifier includes a first input-side two-port network connected to the first output of the splitter, a first amplifier connected to an output of the first input-side two-port network, and a first output-side two-port network connected between an output of the first amplifier and the first input of the combiner. The peak amplifier includes a second input-side two-port network connected to the second output of the splitter, a second amplifier connected to the output of the second input-side two-port network, and a second output-side two-port network connected between an output of the second amplifier and the second input of the combiner. The combiner is a series-connected load type, having a series connection of the output-side two-port network of the carrier amplifier and the output-side two-port network of the peak amplifier for the output terminal at a combining point. The load impedance at the combining point is expressed using a complex number.

In some embodiments, if the load impedance at the combining point is ZL', the circuit parameters of the output-side two-port network from the current source end of the carrier amplifier up until the combining point are Fc (Ac, Cc, Cc, Dc), the circuit parameters of the output-side two-port network from the current source end of the peak amplifier up until the combining point are Fp (Ap, Bp, Cp, Dp), the load resistance of the carrier amplifier in the state in which it is not backed off is Roptc, the load resistance of the peak amplifier in the state in which it is not backed off is Roptp, m=1+Roptc/Roptp, and the phase difference between the phase of the current source of the carrier amplifier and the phase of the current source of the peak amplifier is θ, within a transmission frequency band, the relationships:

$$(Ac \times Dp + Bc \times Cp + Ac \times Cp \times ZL')/(Cc \times Dp + Cp \times Dc + Cc \times Cp \times ZL') = m \times Roptc \quad (5)$$

$$\Delta c/(Cc \times Dp + Cp \times Dc + Cc \times Cp \times ZL') = -Roptc \times e^{j \times \theta} \quad (6)$$

$$\Delta p/(Cc \times Dp + Cp \times Dc + Cc \times Cp \times ZL') = Roptc \times e^{-j \times \theta} \text{ and} \quad (7)$$

$$(Ap \times Dc + Bp \times Cc + Ap \times Cc \times ZL')/(Cc \times Dp + Cp \times Dc + Cc \times Cp \times ZL') = 0 \quad (8)$$

are satisfied, where $\Delta c - Ac \times Dc - Bc \times Cc$ and $\Delta p - Ap \times Dp - Bp \times Cp$.

Some embodiments are directed to a method for determining circuit parameters of a Doherty amplifier. The Doherty amplifier may include, but is not limited to, an input terminal, an output terminal, a splitter, a combiner, a carrier amplifier, and a peak amplifier. The splitter connects to the input terminal. The splitter has first and second outputs. The combiner connects to the output terminal. The combiner has first and second inputs. The carrier amplifier includes a first input-side two-port network connected to the first output of the splitter, a first amplifier connected to an output of the first input-side two-port network, and a first output-side two-port network connected between an output of the first amplifier and the first input of the combiner. The peak amplifier includes a second input-side two-port network connected to the second output of the splitter, a second amplifier connected to the output of the second input-side two-port network, and a second output-side two-port network connected between an output of the second amplifier and the second input of the combiner. The method may include determining circuit parameters of the output-side two-port network of the carrier amplifier and the output-side two-port network of the peak amplifier so that the combiner is a parallel-connected load type having a parallel connection of the output-side two-port network of the carrier amplifier and the output-side two-port network of the peak amplifier for the output terminal at a combining point, and that a load admittance at the combining point is expressed using a complex number.

In some embodiments, if the load admittance at the combining point is YL', the circuit parameters of the output-side two-port network from the current source end of the carrier amplifier up until the combining point are Fc (Ac, Cc, Cc, Dc), the circuit parameters of the output-side two-port network from the current source end of the peak amplifier up until the combining point are Fp (Ap, Bp, Cp, Dp), the load resistance of the carrier amplifier in the state in which it is not backed off is Roptc, the load resistance of the peak amplifier in the state in which it is not backed off is Roptp, m=1+Roptc/Roptp, and the phase difference between the phase of the current source of the carrier amplifier and the phase of the current source of the peak amplifier is θ, within a transmission frequency band, the relationships:

$$(Ac \times Dp + Bc \times Cp + Bc \times Dp \times YL')/(Cc \times Dp + Cp \times Dc + Dc \times Dp \times YL') = m \times Roptc \quad (1)$$

$$\Delta c/(Cc \times Dp + Cp \times Dc + Dc \times Dp \times YL') = -Roptc \times e^{j \times \theta} \quad (2)$$

$$\Delta p/(Cc \times Dp + Cp \times Dc + Dc \times Dp \times YL') = Roptc \times e^{-j \times \theta}, \text{ and} \quad (3)$$

$$(Ap \times Dc + Bp \times Cc + Bp \times Dc \times YL')/(Cc \times Dp + Cp \times Dc + Dc \times Dp \times YL') = 0 \quad (4)$$

are satisfied, where $\Delta c = Ac \times Dc - Bc \times Cc$ and $\Delta p = Ap \times Dp - Bp \times Cp$.

Some embodiments are directed to a method for determining circuit parameters of a Doherty amplifier. The Doherty amplifier may include, but is not limited to, an input terminal, an output terminal, a splitter, a combiner, a carrier amplifier, and a peak amplifier. The splitter connects to the input terminal. The splitter has first and second outputs. The combiner connects to the output terminal. The combiner has first and second inputs. The carrier amplifier includes a first input-side two-port network connected to the first output of the splitter, a first amplifier connected to an output of the first input-side two-port network, and a first output-side two-port network connected between an output of the first amplifier and the first input of the combiner. The peak amplifier includes a second input-side two-port network connected to the second output of the splitter, a second amplifier connected to the output of the second input-side two-port network, and a second output-side two-port network connected between an output of the second amplifier and the second input of the combiner. In some embodiments, the combiner is a series-connected load type, having a series connection of the output-side two-port network of the carrier amplifier and the output-side two-port network of the peak amplifier for the output terminal at a combining point. The load impedance at the combining point is expressed using a complex number.

In some embodiments, if the load impedance at the combining point is ZL', the circuit parameters of the output-side two-port network from the current source end of the carrier amplifier up until the combining point are Fc (Ac, Cc, Cc, Dc), the circuit parameters of the output-side two-port network from the current source end of the peak amplifier up until the combining point are Fp (Ap, Bp, Cp, Dp), the load resistance of the carrier amplifier in the state in which it is not backed off is Roptc, the load resistance of the peak amplifier in the state in which it is not backed off is Roptp, m=1+Roptc/Roptp, and the phase difference between the phase of the current source of the carrier amplifier and the phase of the current source of the peak amplifier is θ, within a transmission frequency band, and the method determines the circuit parameters of the output-side two-port network of the carrier amplifier and the output-side two-port network of the peak circuit amplifier so that the relationships $$(Ac \times Dp + Bc \times Cp + Ac \times Cp \times ZL')/(Cc \times Dp + Cp \times Dc + Cc \times Cp \times ZL') = m \times Roptc \quad (5)$$

$$\Delta c/(Cc \times Dp + Cp \times Dc + Cc \times Cp \times ZL') = -Roptc \, e^{j \times \theta} \quad (6)$$

$$\Delta p/(Cc \times Dp + Cp \times Dc + Cc \times Cp \times ZL') = Roptc \, e^{-j \times \theta} \text{ and} \quad (7)$$

$$(Ap \times Dc + Bp \times Cc + Ap \times Cc \times ZL')/(Cc \times Dp + Cp \times Dc + Cc \times Cp \times ZL') = 0 \quad (8)$$

are satisfied, where $\Delta c = Ac \times Dc - Bc \times Cc$ and $\Delta p = Ap \times Dp - Bp \times Cp$.

A Doherty amplifier of embodiments will be described below, with references made to the drawings.

FIG. 1 is a block diagram showing the constitution of a Doherty amplifier 1 of the embodiment. The Doherty amplifier 1 shown in FIG. 1 includes a parallel-connected load type constitution. In the Doherty amplifier 1, a high frequency signal input to the input terminal 10 is amplified and output from the output terminal 20.

The Doherty amplifier 1 includes an input terminal 10, a splitter 12, a carrier amplifier 14, a peak amplifier 16, a combiner 18, and an output terminal 20. The carrier amplifier 14 includes an input-side two-port network C1, an amplifier element C2, and an output-side two-port network C3. The peak amplifier 16 includes an input-side two-port network P1, an amplifier element P2, and an output-side two-port network P3.

A high frequency signal is supplied to the input terminal 10 as an input signal. The high frequency signal is, for example, a signal in the radio frequency (RF) band. The high frequency signal supplied to the input terminal 10 is output to the splitter 12.

The input-sided two-port network C1, the output-side two-port network C3, the input-side two-port network P1, and the output-side two-port network P3 includes, for example, circuits that are formed on the substrate and are combinations of inductors and capacitors. In addition to inductors and capacitors, the input-sided two-port network C1, the output-side two-port network C3, the input-side two-port network P1, and the output-side two-port network P3 may include circuit characteristics optimized by resistors.

The splitter 12 is connected to the input terminal 10 and distributes the high frequency signal to the carrier amplifier 14 and the peak amplifier 16. The high frequency signal amplified by the carrier amplifier 14 and the peak amplifier 16 are power combined in the combiner 18, and output as the output signal from the output terminal 20.

The carrier amplifier 14 is a cascade-connected circuit of the input-side two-port network C1, the amplifier element C2, and the output-side two-port network C3. The amplifier element C2 is, for example, a field effect transistor (FET). The FET, for example, includes its source terminal connected to a ground terminal and a high frequency signal input to the gate terminal from the input-side two-port network C1, and outputs an amplified high frequency signal from the drain terminal to the output-side two-port network C3. The amplifier element C2, for example, includes a gate bias voltage applied thereto so that the FET is operated as a class AB or class B amplifier, and the FET is operated to amplify from a low-power high frequency signal.

The peak amplifier 16 is a cascade-connected circuit of the input-side two-port network P1, the amplifier element P2, and the output-side two-port network P3. The amplifier element P2 is, for example, an FET, includes its source terminal connected to the ground terminal and a high frequency signal input to the gate terminal from the input-side two-port network P1, and outputs an amplified high frequency signal from the drain terminal to the output two-port network P3. The amplifier element P2, for example, includes a gate bias voltage applied thereto so that the FET operates as a class C amplifier, so that the peak amplifier 16 starts amplification operation when a high frequency signal having an amplitude (power value) exceeding a prescribed value is supplied.

In the parallel-connected load type constitution, considering existing Doherty amplifiers, the output-side two-port network C3 includes an odd number of IIN stages, and the output-side two-port network P3 includes an even number of IIN stages (including zero stages). If the number of IIN stages of the output-side two-port network C3 is one more than the number of IIN stages of the output-side two-port network P3, this is a Doherty amplifier, and if it is one fewer, this is referred to as an inverted Doherty amplifier. The Doherty amplifier 1 of the embodiments may include an output-side two-port network C3 with a number of IIN stages that is one more than the number of IIN stages of the output-side two-port network P3, and may be what is called an inverted Doherty amplifier that includes less IIN stages. The splitter 12, the input-side two-port network C1, and the input-side two-port network P1 adjust the phase so that the output signal of the carrier amplifier 14 and the output signal of the peak amplifier 16 that are combined at the combiner 18 are in-phase.

Figure 2:
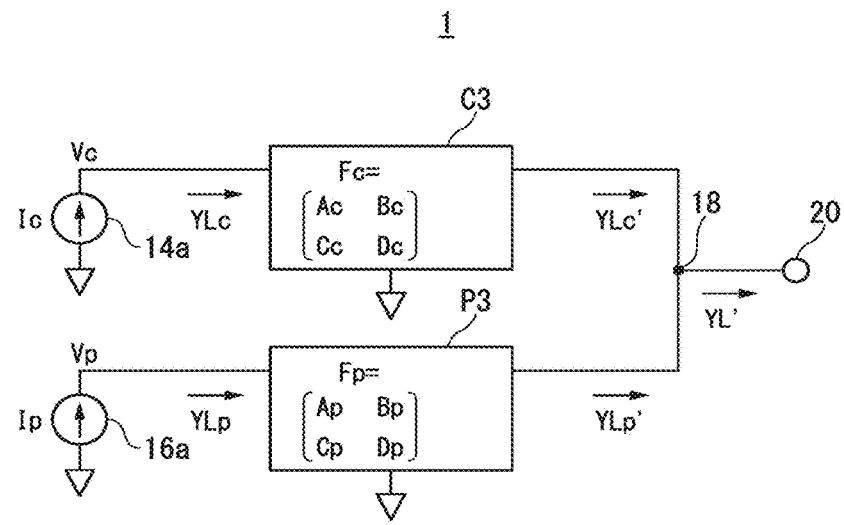
FIG. 2 shows an equivalent circuit of the output side of the parallel-connected load type Doherty amplifier of the embodiment.

FIG. 2 is an equivalent circuit of the output side of the Doherty amplifier 1 of the embodiment. The current from the current source 14a of the amplifier element C2 is Ic, the voltage thereof is Vc, and the current from the current source 16a of the amplifier element P2 is Ip, and the voltage thereof is Vp. The F parameter of the output-side two-port network C3 is Fc (with elements Ac, Bc, Cc, and Dc), and the F parameter of the output-side two-port network P3 is Fp (with elements Ap, Bp, Cp, and Dp). In this case, the parasitic reactances such as the output capacitances of the amplifier element C2 and the amplifier element P2 are included Fc and Fp.

The relationships between Vc, Vp, Ic, and Ip at the ends of the current source 14a and 16a in FIG. 2 are expressed by Equations (1) to (6). In the Equation (3), Equation (4), Equation (5), and Equation (6) below, the load admittance YL' at the combiner 18 (combining point) is expressed as a complex value. That is, in the Doherty amplifier 1 of the embodiment, the circuit parameters from the signal output terminal of the carrier amplifier 14 at which the high frequency signal is supplied up to the combiner 18 and the circuit parameters from the signal output terminal of the peak amplifier 16 at which a high frequency signal is supplied up to the combiner 18 are established so as to have an admittance (complex admittance) expressed by a complex value. That is, in the Doherty amplifier 1 of the embodiment, rather than circuit parameters expressed as real numbers as in existing Doherty amplifiers, the circuit parameters are determined so as to expand to a complex admittance expressed by complex values.

$$Vc = Kcc \times Ic + Kcp \times Ip \quad \text{Equation (1)}$$

$$Vp = Kpp \times Ip + Kpc \times Ic \quad \text{Equation (2)}$$

$$Kcc = (Ac \times Dp + Bc \times Cp + Bc \times Dp \times YL')/(Cc \times Dp + Cp \times Dc + Dc \times Dp \times YL') \quad \text{Equation (3)}$$

$$Kcp = \Delta c/(Cc \times Dp + Cp \times Dc + Dc \times Dp \times YL') \quad \text{Equation (4)}$$

$$Kpc = \Delta p/(Cc \times Dp + Cp \times Dc + Dc \times Dp \times YL') \quad \text{Equation (5)}$$

$$Kpp = (Ap \times Dc + Bp \times Cc + Bp \times Dc \times YL')/(Cc \times Dp + Cp \times Dc + Dc \times Dp \times YL') \quad \text{Equation (6)}$$

In the above, $\Delta c = Ac \times Dc - Bc \times Cc$ and $\Delta p = Ap \times Dp - Bp \times Cp$.

Figure 11:
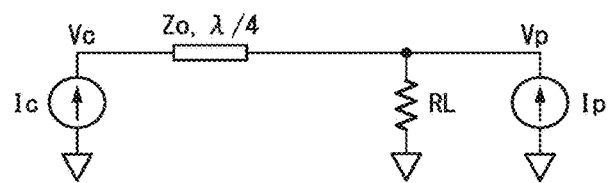
FIG. 11 shows a basic equivalent circuit of a parallel-connected load type Doherty amplifier of a comparison example.

In this case, the voltages and currents at the ends of the current sources 14a and 16a in the Doherty amplifier 1 of the embodiment are compared with those in a Doherty amplifier of a comparison example. FIG. 11 is the basic equivalent circuit of a parallel-connected load type Doherty amplifier of the comparison example. In the Doherty amplifier of the comparison example, there are no parasitic reactance such as output capacitances in the amplifier element of the carrier amplifier and the amplifier element of the peak amplifier. The output-side two-port network in the carrier amplifier is a distributed constant line having an electrical length of λ/4 (1/4 wavelength) with characteristic impedance of Zo. There is no output-side two-port network in the peak amplifier, and the amplifier element of the peak amplifier is directly coupled to the combiner. In FIG. 11, Ic, Vc, Ip, and Vp are the same current source end voltages and currents as in FIG. 2, and the load admittance $YL'=1/RL$ is a pure conductance.

In the Doherty amplifier 1 of the embodiment, if BO=0, meaning that there is no back-off, if the current of the current source 14a of the amplifier element C2 in the carrier amplifier 14 is Isc, the optimum load resistance is Roptc, the current of the current source 16a of the amplifier element P2 in the peak amplifier 16 is Isp, and the optimum load resistance is Roptp, then m−1=Roptc/Roptp=Isp/Isc. Zo=Roptc, RL=Roptc/m, and θ is the phase difference between the peak amplifier current source phase and the carrier amplifier current source phase, the input side being optimized so that the peak amplifier 16 starts amplifying operation when this is, for example, π/2, at BO=20×log$_{10}$(m). In this case, in the range 0≤Ic≤Isc/m, the peak amplifier 16 is in the off state, in which it does not amplify, and the output power of Vc, Vp, Ic, Ip and the carrier amplifier 14, the output power of the peak amplifier 16, and the total output power are expressed by the following equations.

$$Ic = Isc \times 10^{-BO/20}$$
$$Ip = 0$$
$$Vc = m \times Roptc \times Ic$$
$$= m \times Roptc \times Isc \times 10^{-BO/20}$$

-continued $$Vp = Roptc \times e^{-j \times \theta} \times Ic$$
$$= Roptc \times e^{-j \times \theta} \times Isc \times 10^{-BO/20}$$

Carrier amplifier 14 output power: $Poc = m \times Roptc \times Isc^2 \times 10^{-BO/10}$
Peak amplifier 16 output power: $Pop = 0$
Total output power: $Pot = m \times Roptc \times Isc^2 \times 10^{-BO/10}$ In the range Isc/m≤Ic≤Isc, the peak amplifier 16 is in the on condition, in which it amplifies, and Vc, Vp, Ic, Ip, the output power of the carrier amplifier 14, the output power of the peak amplifier 16, and the total output power are expressed by the following equations.

$$Ic = Isc \times 10^{-BO/20} \quad \text{Equation (7)}$$

$$Ip = e^{-j \times \theta} \times (m \times Ic - Isc) \quad \text{Equation (8)}$$
$$= e^{-j \times \theta} \times Isc \times (m \times 10^{-BO/20} - 1)$$

$$Vc = m \times Roptc \times Ic - Roptc \times e^{-j \times \theta} \times Ip \quad \text{Equation (9)}$$
$$= Roptc \times Isc$$

$$Vp = Roptc \times e^{-j \times \theta} \times Ic \quad \text{Equation (10)}$$
$$= Roptc \times e^{-j \times \theta} \times Isc \times 10^{-BO/20}$$

Figure 12:
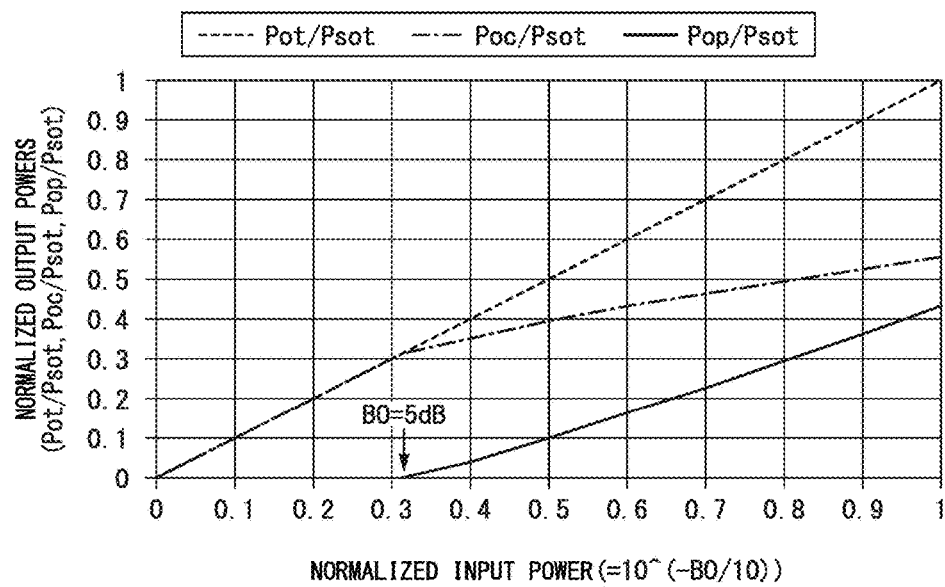
FIG. 12 shows the relationship between the reference input power, the normalized total output power, the output power of the carrier amplifier, and the output power of the peak amplifier.

Carrier amplifier 14 output power: $Poc = Roptc \times Isc \times Ic$
Peak amplifier 16 output power: $Pop = Roptc \times (m \times Ic^2 - Isc \times Ic)$
Total output power: $Pot = m \times Roptc \times Isc^2 \times 10^{-BO/10}$ With the output power of the Doherty amplifier 1 for the case in which BO=0 dB as $Psot = m \times Roptc \times Isc_2$, and if, for example, the peak amplifier 16 starts amplifying operation at m=1.782, meaning it starts amplifying at BO=5 dB, if each output power is normalized for input power dependency, the results are as shown in FIG. 12. FIG. 12 shows the relationship between the reference input power, the normalized total output power, the output power of the carrier amplifier 14, and the output power of the peak amplifier 16. According to FIG. 12, the total output power Pot is proportional to the input power over the entire range. From a small signal having a low input power up until BO=5 dB, the peak amplifier 16 is in the off state and the output power Poc of the carrier amplifier 14 is proportional to the input power. When the input power exceeds BO=5 dB, the output power Poc of the carrier amplifier 14 is proportional to the square root of the input power, and the output power Pop of the peak amplifier 16 that goes into the on state is Pot-Poc.

In the case in which, if Equation (1) and Equation (2), which express the relationship between Vc, Vp, Ic and Ip at the ends of the current sources 14a and 16a in the Doherty amplifier 1 of the embodiment when the load admittance YL' is a complex value, are equal to Equation (9) and Equation (10), which express the relationship between Vc, Vp, Ic and Ip in the comparison example when the load admittance YL' is a pure conductance (1/RL), in the Doherty amplifier of the comparison example, the output power Poc of the carrier amplifier 14 in the Doherty amplifier 1 of the embodiment, the output power Pop of the peak amplifier 16, and the total output power Pot have the characteristics shown in FIG. 12.

If the Vc, Vp, Ic, and Ip of Equation (7) to Equation (10) are substituted into Vc, Vp, Ic, and Ip of Equation (1) and Equation (2) and the result is rearranged, Kcc and Kpp are expressed by the following equations.

$$Kcc + Kcp \times e^{-j\times\theta} \times (m - 10^{BO/20}) = Roptc \times 10^{BO/20}$$

$$Kpp \times e^{-j\times\theta} \times 10^{-BO/20} \times (m - 10^{BO/20}) + Kpc \times 10^{-BO/20} = Roptc \times e^{-j\times\theta} \times 10^{-BO/20}$$

The conditions under which the above apply for an arbitrary BO, and within the transmission frequency band, are the following Equation (11) to Equation (14).

$$Kcc = (Ac \times Dp + Bc \times Cp + Bc \times Dp \times YL')/(Cc \times Dp + Cp \times Dc + Dc \times Dp \times YL') = m \times Roptc \quad \text{Equation (11)}$$

$$Kcp = \Delta c/(Cc \times Dp + Cp \times Dc + Dc \times Dp \times YL') = -Roptc \times e^{j\times\theta} \quad \text{Equation (12)}$$

$$Kpc = \Delta p/(Cc \times Dp + Cp \times Dc + Dc \times Dp \times YL') = Roptc \times e^{-j\times\theta} \quad \text{Equation (13)}$$

$$Kpp = ((Ap \times Dc + Bp \times Cc + Bp \times Dc \times YL')/(Cc \times Dp + Cp \times Dc + Dc \times Dp \times YL') = 0 \quad \text{Equation (14)}$$

Even if Fc and Fp are reciprocal lossless two-port networks, because the total degree of freedom is 8, one complex admittance solution exists for the four complex number equations, Equation (11) to Equation (14) with respect to the complex admittance YL'.

As described above, because the Doherty amplifier 1 of the embodiment expands the load admittance from a real value to a complex value, it is possible to expand the design space from real values to complex values, thereby increasing the degree of design freedom and enabling a broadband design.

Next, a specific constitution in the above-described Doherty amplifier 1 will be described.

Figure 3:
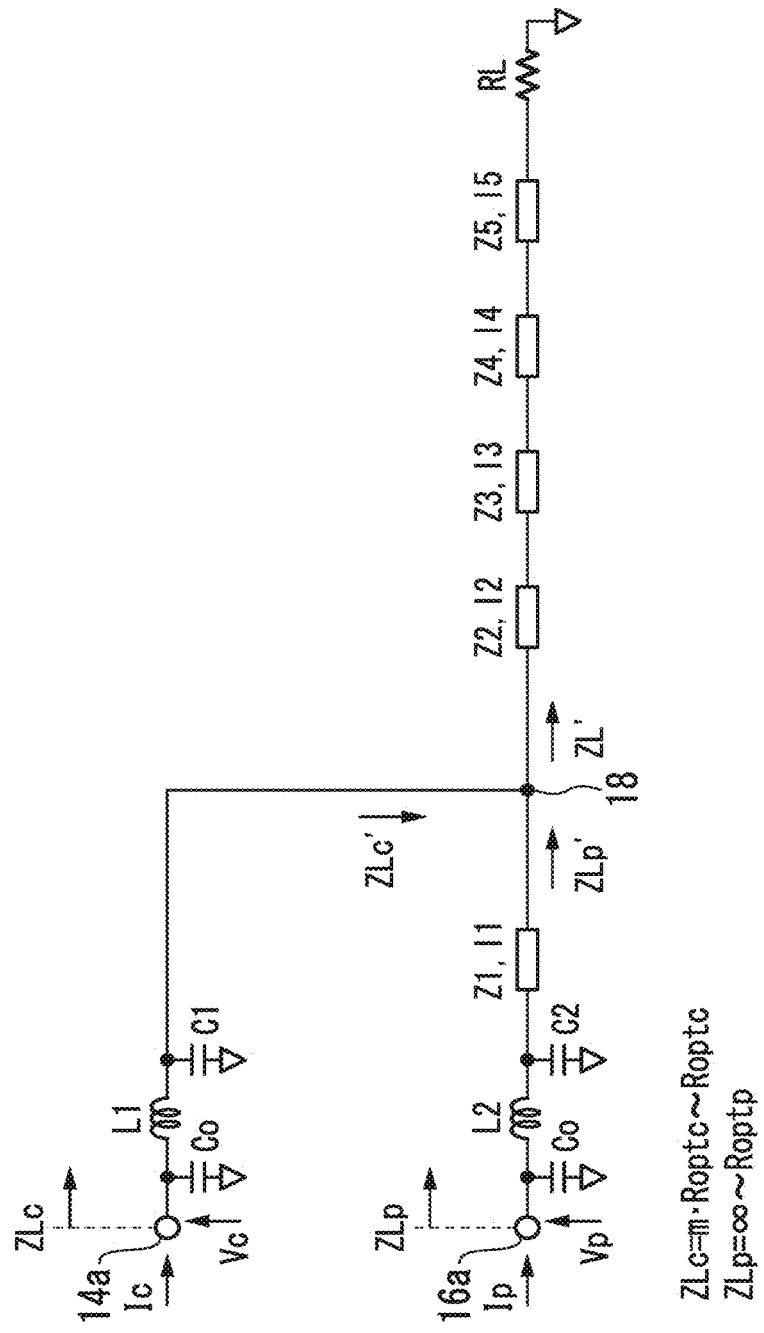
FIG. 3 is a circuit diagram showing a part of the parallel-connected load type constitution in the Doherty amplifier of the embodiment.

FIG. 3 is a circuit diagram showing a part of the parallel-connected load type constitution in the Doherty amplifier 1 of the embodiment. FIG. 4 is a drawing showing the setting of the circuit elements included in the parallel-connected load type Doherty amplifier 1 in the embodiment. The Doherty amplifier 1 shown in FIG. 3 is shown as the constitution from the end of the current source 14*a* of the carrier amplifier 14 and the end of the current source 16*a* of the peak amplifier 16 up until the load RL. The impedance between the load RL side and the end of the current source 14*a* of the carrier amplifier 14 will be made ZLc and the impedance between the load RL and the end of the current source 16*a* of the peak amplifier 16 will be made ZLp.

A π-configured circuit is connected to the end of the current source 14*a* of the carrier amplifier 14 and the end of the current source 16*a* of the peak amplifier 16. The Co of the π-configured circuit connected to the carrier amplifier 14 is the output capacitance of the FET in the carrier amplifier 14. The Co of the π-configured circuit connected to the peak amplifier 16 is the output capacitance of the FET in the peak amplifier 16. The peak amplifier 16 has connected thereto, in addition to the π-configured circuit, a distributed constant line having a characteristic impedance Z1 and also a length l1. When this circuit corresponds to the case of the load admittance being a pure conductance, such as the Doherty amplifier of the comparison example, the Doherty amplifier is a parallel-connected load type inverted Doherty amplifier in which the carrier amplifier 14 side includes one stage of IIN (π-configured circuit) and the peak amplifier 16 side includes two stages of IIN (π-configured circuit and Z1).

The load impedance of the carrier amplifier 14 at the combiner 18 will be made ZLc', the load impedance of the peak amplifier 16 at the combiner 18 will be made ZLp', and the impedance between the load RL side and the combiner 18 (combining point) will be made ZL'. A two-port network that converts from the impedance ZL' to the load RL is disposed between the combiner 18 and the load RL. This two-port network includes a line having a length of 12 and a characteristic impedance of Z2, a line having a length of 13 and a characteristic impedance of Z3, a line having a length of 14 and a characteristic impedance of Z4, and a line having a length of 15 and a characteristic impedance of Z5. This impedance converting circuit may be a lumped constant circuit rather than a distributed constant line.

The values at various parts in a Doherty amplifier 1 such as noted above, are set, for example, as shown in FIG. 4. The values shown in FIG. 4 are set so as to supply a high frequency signal to the load RL with good efficiency in a state in which a high frequency signal of a prescribed frequency band is input to the Doherty amplifier 1. The setting example shown in FIG. 4 has the following setting conditions (1) to (4).

$$\omega o \times Co \times Roptc = 1.3 \quad (1)$$

$$RL/Roptc = 4 \quad (2)$$

$$m = 1 + n = 1.78 \quad (3)$$

$$BO = 20 \times \log_{10}(m) = 5 \text{ dB (turn the peak amplifier } 16 \text{ on at a back-off of 5 dB)} \quad (4)$$

Figure 5:
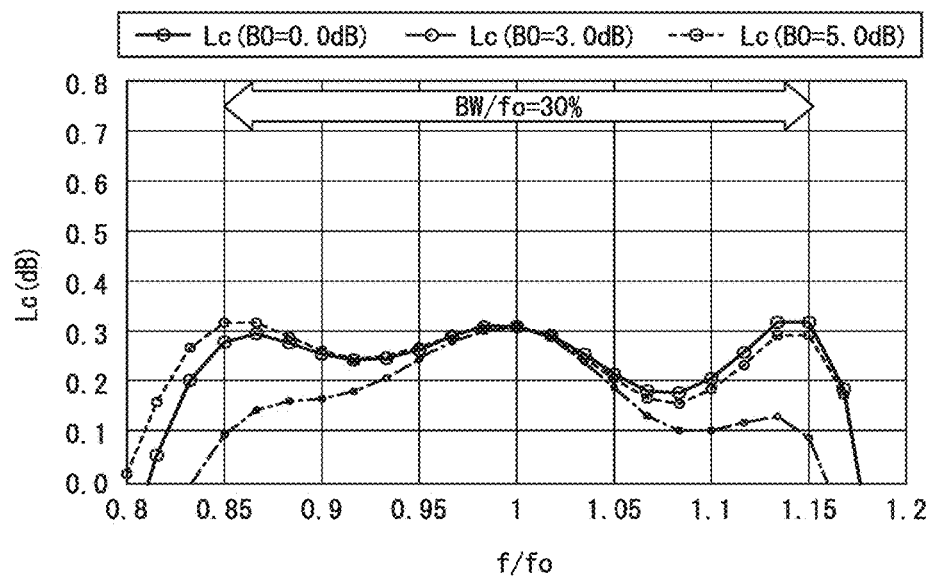
FIG. 5 shows the relationship, in the Doherty amplifier of the embodiment, at each back-off value, between the frequency (f/fo) and the combined loss $Lc=10 \times \log_{10}$ (ideal Pot/calculated Pot), which is defined by the ratio of the ideal and calculated total output power Pot.

In the constitution shown in FIG. 3, the Doherty amplifier 1 set as shown in FIG. 4 has the frequency characteristics shown in FIG. 5. FIG. 5 shows the relationship, in the Doherty amplifier 1 of the embodiment, at each back-off value, between the frequency (f/fo) and the combined loss $Lc = 10 \times \log_{10}$ (ideal Pot/calculated Pot) defined by the ratio of the ideal and calculated the output power Pot.

In FIG. 5, fo is a prescribed basic frequency, and f is the frequency of the high frequency signal input to the Doherty amplifier 1. According to FIG. 5, in the frequency band in which f/fo is from 0.85 to 1.15, the combined loss Lc of the high frequency signal is in the range of approximately 0.1 to 0.3 dB. This combined loss Lc is 0.317 dB or lower. The frequency band in which f/fo is from 0.85 to 1.15 corresponds to a bandwidth of 30% with respect to the frequency fo.

Figure 6:
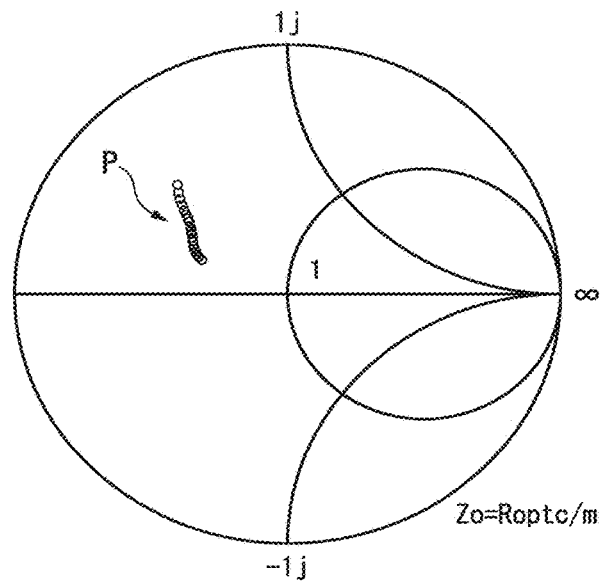
FIG. 6 is a Smith chart (impedance chart) showing the load impedance $ZL'=1/YL'$ between the load RL side and the combiner in the Doherty amplifier of the embodiment.

FIG. 6 is a Smith chart (impedance chart) showing the load impedance ZL'=1/YL' between the load RL side and the combiner 18 (combining point) in the Doherty amplifier 1 of the embodiment. According to FIG. 6, the plot P that represents the load impedance ZL' of the Doherty amplifier 1 moves away from the real axis and is broadens to include the imaginary value region. From this, by making the load a complex impedance (complex admittance), the Doherty amplifier 1 includes the combined loss Lc with the good frequency characteristics shown in FIG. 5. That is, in the Doherty amplifier 1 of the embodiment, the circuit parameters from the combiner 18 up to the load RL are determined so that the load admittance at the combining point 18 is a complex value.

Figure 7:
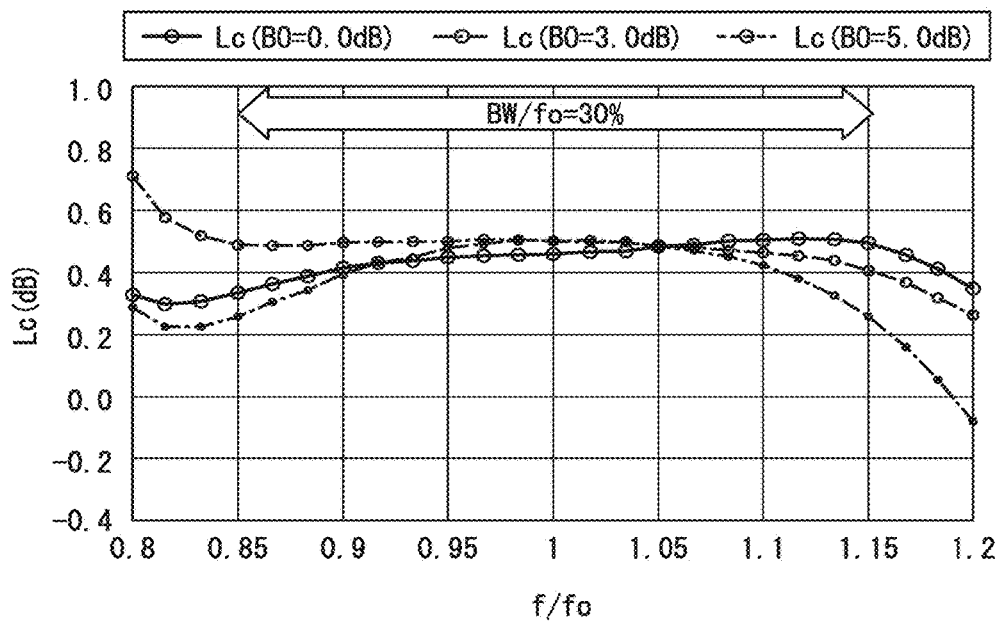
FIG. 7 is a drawing showing the frequency characteristics of a Doherty amplifier of a comparison example.
Figure 8:
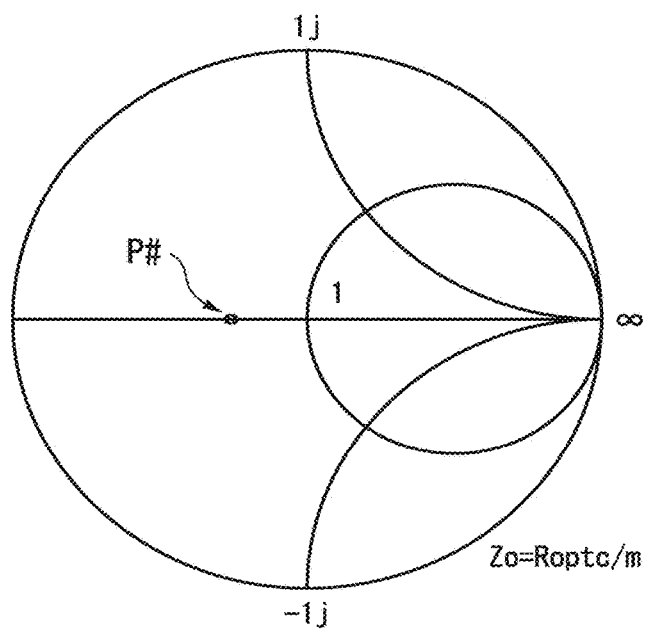
FIG. 8 is a Smith chart showing the load impedance $ZL'$ in a Doherty amplifier of the comparison example.

FIG. 7 shows the frequency characteristics of the Doherty amplifier of a comparison example. FIG. 8 is a Smith cart showing the load impedance ZL' in a Doherty amplifier of the comparison example. The value of various parts in FIG. 3 are set in the Doherty amplifier of the comparison example to be different from those of the Doherty amplifier 1 of the embodiment as shown in FIG. 4.

According to FIG. 8, with the Doherty amplifier of the comparison example, the load impedance is plotted at P# on the real axis. As shown in FIG. 7, in the frequency band range in which f/fo is from 0.85 to 1.15, the high frequency signal combined loss Lc is in the range of approximately 0.2 to 0.5 dB, and at less than 0.503 dB, the combined loss is approximately 0.2 dB worse than in FIG. 5.

If the Doherty amplifier 1 of the embodiment is compared to the Doherty amplifier of the comparison example, in contrast to the Doherty amplifier of the comparison example, which is limited to the real axis of the Smith cart, with the Doherty amplifier 1 of the embodiment, the design space is broadened to encompass a wide range of complex impedance that is away from the real axis, enabling a good combined loss Lc having the frequency characteristics as shown in FIG. 5.

Figure 9:
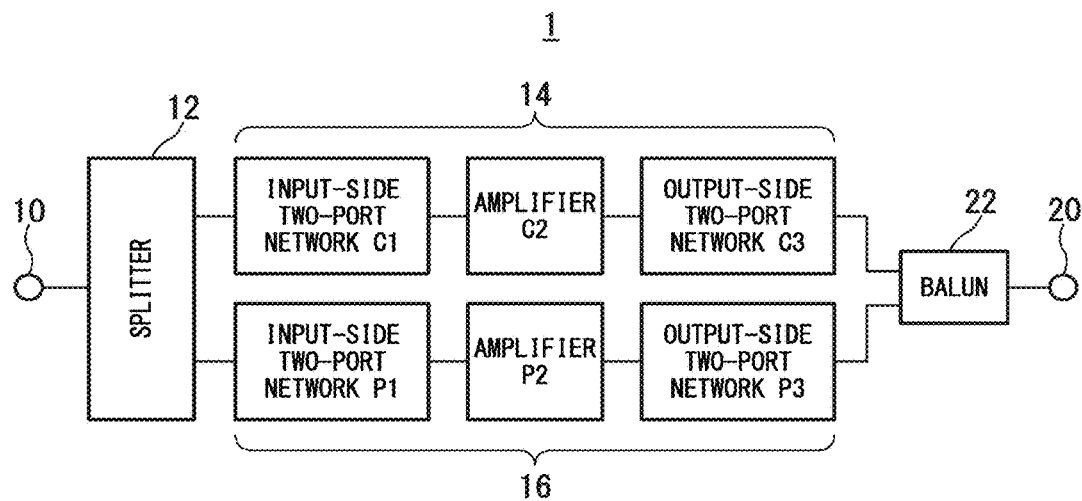
FIG. 9 is a block diagram showing the series-connected load type constitution of a Doherty amplifier of the embodiment.

Next, the series-connected load type constitution in the Doherty amplifier 1 of the embodiment will be described. FIG. 9 is a block diagram showing the series-connected load type constitution of the Doherty amplifier 1 of the embodiment. As shown in FIG. 9, this Doherty amplifier 1 includes a converter such as a balun 22. The balun 22 may perform as a converter that converts a high frequency signal between a balanced line and an unbalanced type line. The converter will hereinafter be referred to as "balun". The balun 22, for example, includes one end connected to the output-side two-port network C3 and P3 and the other end connected to the output terminal 20. In the Doherty amplifier 1 the output-side two-port network C3, the output-side two-port network P3, and the output terminal 20 are connected in series. The other parts of FIG. 9 are the same as in FIG. 1.

Because of this series-connected load type constitution, in the case of an existing Doherty amplifier, there are an even number of IIN stages (including zero) in the output-side two-port network C3 and an odd number of IIN stages in the output-side two-port network P3. If the number of IIN stages of the output-side two-port network C3 is fewer than the number of IIN stages of the output-side two-port network P3, this is a Doherty amplifier, and if it is one more, this is referred to as an inverted Doherty amplifier. The splitter 12, the input-side two-port network C1, and the input-side two-port network P1 adjust the phase so that the outputs of the carrier amplifier 14 and the peak amplifier 16 are inverted phases at the input end of the balun 22.

Figure 10:
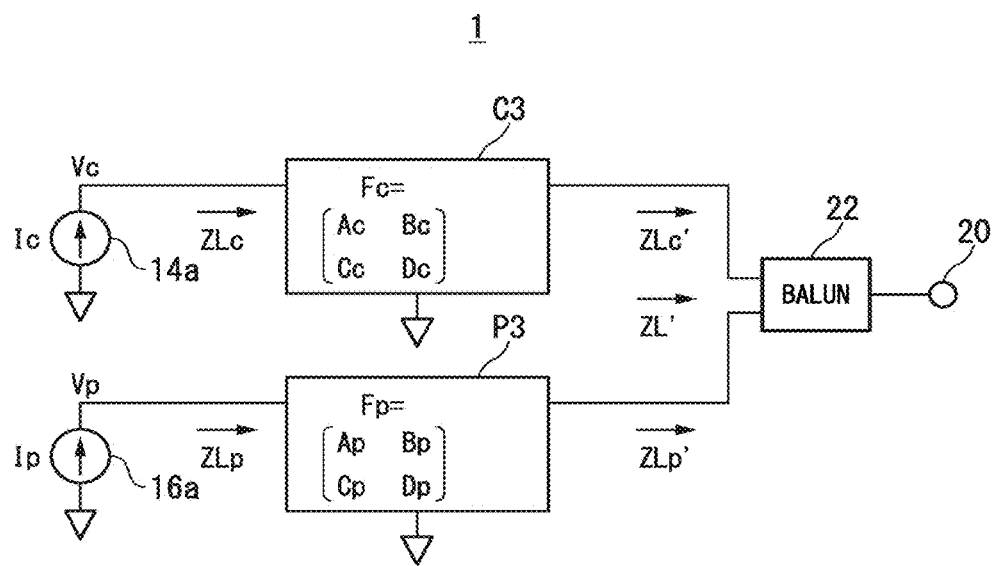
FIG. 10 shows an equivalent circuit of the output side of the series-connected load type Doherty amplifier of the embodiment.

FIG. 10 is a drawing of the equivalent circuit of the output side of the series-connected load type Doherty amplifier 1 of the embodiment. In the description to follow, although the admittance Y will be indicated converted to the impedance Z, the definitions of other symbols are the same as in FIG. 2.

The relationships between Vc, Vp, Ic, and Ip at the ends of the current sources 14*a* and 16*a* in FIG. 10 are expressed by the following Equation (15) to Equation (20).

$$Vc = Kcc \times Ic + Kcp \times Ip \quad \text{Equation (15)}$$

$$Vp = Kpp \times Ip + Kpc \times Ic \quad \text{Equation (16)}$$

$$Kcc = (Ac \times Dp + Bc \times Cp + Ac \times Cp \times ZL')/(Cc \times Dp + Cp \times Dc + Cc \times Cp \times ZL') \quad \text{Equation (17)}$$

$$Kcp = \Delta c/(Cc \times Dp + Cp \times Dc + Cc \times Cp \times ZL') \quad \text{Equation (18)}$$

$$Kpc = \Delta p/(Cc \times Dp + Cp \times Dc + Cc \times Cp \times ZL') \quad \text{Equation (19)}$$

$$Kpp = (Ap \times Dc + Bp \times Cc + Ap \times Cc \times ZL')/(Cc \times Dp + Cp \times Dc + Cc \times Cp \times ZL') \quad \text{Equation (20)}$$

In the above, $\Delta c = Ac \times Dc - Bc \times Cc$ and $\Delta p = Ap \times Dp - Bp \times Cp$.

The end voltages and currents of the current sources 14*a* and 16*a* in the series-connected load type Doherty amplifier 1 are compared with the voltages and currents at the current source end in the Doherty amplifier of the comparison example.

Figure 13:
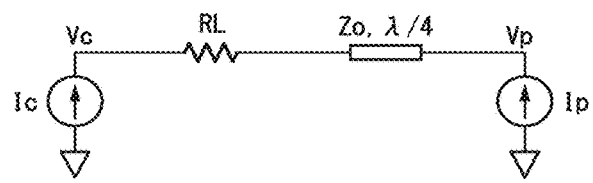
FIG. 13 is a basic equivalent circuit of the series-connected load type Doherty amplifier of the comparison example.

FIG. 13 shows the basic equivalent circuit of the series-connected load type Doherty amplifier of the comparison example. FIG. 13 shows the amplifier element of the carrier amplifier as a current source that outputs the current Ic and shows the amplifier element of the peak amplifier as a current source that outputs the current Ip. According to FIG. 13, the parasitic reactances such as the output capacitances of the amplifier element in the carrier amplifier and the amplifier element in the peak amplifier are ignored. The output-side two-port network in the peak amplifier is a distributed constant line having a characteristic impedance of Zo and an electrical length of λ/4 (1/4 wavelength). The carrier amplifier is not connected to the output-side two-port network, but is directly connected to the load RL. Ic, Vc, Ip, and Vp at the ends of the current sources are the same as in FIG. 10, and the load inductance is ZL'=RL, which is a pure resistance.

Symbols such as Isc are the same as in FIG. 11, which shows the parallel-connected load type Doherty amplifier, Zo=Roptc, RL=m×Roptc, θ=π/2, and the input side is optimized so that the peak amplifier starts amplifying operation when $BO = 20 \times 10_{10}$ (m). In this case, Vc, Vp, Ic, Ip, the output power of the carrier amplifier 14, the output power of the peak amplifier 16, and the total output power are expressed by the following equations.

In the range $0 \leq Ic \leq Isc/m$, the peak amplifier is in the off state, in which it does not amplify, and:

$$Ic = Isc \times 10^{-BO/20}$$

$$Ip = 0$$

$$Vc = m \times Roptc \times Ic$$
$$= m \times Roptc \times Iscc \times 10^{-BO/20}$$

$$Vp = Roptc \times e^{-j \times \theta} \times Ic$$
$$= Roptc \times e^{-j \times \theta} \times Isc \times 10^{-BO/20}$$

Carrier amplifier output power: $Poc = m \times Roptc \times Isc^2 \times 10^{-BO/10}$ Peak amplifier output power: $Pop = 0$ Total output power: $Pot = m \times Roptc \times Isc^2 \times 10^{-BO/10}$ In the range $Isc/m \leq Ic \leq Isc$, the peak amplifier is in the on state, in which it amplifies, and Vc, Vp, Ic, Ip, the output power of the carrier amplifier 14, the output power of the peak amplifier 16, and the total output power are expressed by the following equations.

$$Ic = Isc \times 10^{-BO/20} \quad \text{Equation (21)}$$

$$Ip = e^{-j \times \theta} \times (m \times Ic - Isc) \quad \text{Equation (22)}$$
$$= e^{-j \times \theta} \times Isc \times (m \times 10^{-BO/20} - 1)$$

$$Vc = m \times Roptc \times Ic - Roptc \times e^{j \times \theta} \times Ip \quad \text{Equation (23)}$$
$$= Roptc \times Isc$$

$$Vp = Roptc \times e^{-j \times \theta} \times Ic \quad \text{Equation (24)}$$
$$= Roptc \times e^{-j \times \theta} \times Isc \times 10^{-BO/20}$$

Carrier amplifier output power: $Poc = Roptc \times Isc \times Ic$

Peak amplifier output power: $Pop = Roptc \times (m \times Ic^2 - Isc \times Ic)$ Total output power: $Pot = m \times Roptc \times Isc^2 \times 10^{-BO/10}$ From the above equations, the series-connected load type Doherty amplifier 1 has the same characteristics as the parallel-connected load type Doherty amplifier. Therefore, the normalized input-output characteristics such as shown in FIG. 12 are the same for the series-connected load type Doherty amplifier 1 of the embodiment as they are for the parallel-connected load type Doherty amplifier of the embodiment described above.

If the Vc, Vp, Ic, and Ip of Equation (21) to Equation (24) are substituted into Vc, Vp, Ic, and Ip of Equation (15) and Equation (16) and the result is rearranged, Kcc and Kcp are expressed by the following equations.

$$Kcc + Kcp \times e^{-j\times\theta} \times (m - 10^{BO/20}) \times Roptc \times 10^{BO/20}$$

$$Kpp \times e^{-j\times\theta} \times 10^{-BO/20} \times (m - 10^{BO/20}) + Kpc \times 10^{-BO/20} = Roptc \times e^{-j\times\theta} \times 10^{-BO/20}$$

The conditions under which the above apply for an arbitrary BO are as follows.

$$Kcc = (Ac \times Dp + Bc \times Cp + Ac \times Cp \times ZL')/(Cc \times Dp + Cp \times Dc + Cc \times Cp \times ZL') = m \times Roptc \quad \text{Equation (25)}$$

$$Kcp = \Delta c/(Cc \times Dp + Cp \times Dc + Cc \times Cp \times ZL') - -Roptc \times e^{-j\times\theta} \quad \text{Equation (26)}$$

$$Kpc = \Delta p/(Cc \times Dp + Cp \times Dc + Cc \times Cp \times ZL') = Roptc \times e^{-j\times\theta} \quad \text{Equation (27)}$$

$$Kpp = (Ap \times Dc + Bp \times Cc + Ap \times Cc \times ZL')/(Cc \times Dp + Cp \times Dc + Cc \times Cp \times ZL') = 0 \quad \text{Equation (28)}$$

Even if Fc and Fp are reciprocal lossless two-port networks, because the total degree of freedom is 8, one solution exists for the four complex number equations in Equation (25) to Equation (28) with respect to ZL.

As described above, because the series-connected load type Doherty amplifier 1 of the embodiment can expand the load impedance from a real value to a complex value, it is possible to expand the design space from real values to complex values, thereby increasing the degree of design freedom and enabling a broadband design.

The Doherty amplifier (1) of the embodiment described above includes a carrier amplifier (14) that includes the splitter (12) connected to the input terminal (10), the combiner (18) connected to the output terminal (20), the input-side two-port network (C1) connected to one output terminal of the splitter (12), the amplifier element (C2) connected to the output terminal of the input-side two-port network (C1), and the output-side two-port network (C3) connected between the output terminal of the amplifier element (C2) and one input terminal of the combiner (18); and a peak amplifier (16) that includes the input-side two-port network (P1) connected to the other output terminal of the splitter (12), the amplifier element (P2) connected to the output terminal of the input-side two-port network (P1), and the output-side two-port network (P3) connected between the output terminal of the amplifier element (P2) and the other input terminal of the combiner (18), wherein, the combiner (18) is a parallel-connected load type having a parallel connection of the output-side two-port network (C3) of the carrier amplifier (14) and the output-side two-port network (P3) of the peak amplifier (16) for the output terminal (20) at a combining point (18), wherein a load admittance at the combining point (18) is expressed using a complex number.

In the Doherty amplifier (1) of the embodiment, if the load admittance at the combining point (18) is YL', the circuit parameters of the output-side two-port network (P3) from the current source end of the peak amplifier (16) up to the combining point (18) are Fp (Ap, Bp, Cp, Dp), the circuit parameters of the output-side two-port network (P3) from the current source end of the carrier amplifier (14) up to the combining point (18) are Fc (Ac, Bc, Cc, Dc), the load resistance of the carrier amplifier (14) in the state in which it is not backed off is Roptc, the load resistance of the peak amplifier (16) in the state in which it is not backed off is Roptp, m=1+Roptc/Roptp, and the phase difference between the phase of the current source of the carrier amplifier (14) and the phase of the current source of the peak amplifier (16) is θ, within a transmission frequency band, the following relationships (1) to (4) are satisfied.

$$(Ac \times Dp + Bc \times Cp + Bc \times Dp \times YL')/(Cc \times Dp + Cp \times Dc + Dc \times Dp \times YL') = m \times Roptc \quad (1)$$

$$\Delta c/(Cc \times Dp + Cp \times Dc + Dc \times Dp \times YL') - -Roptc \times e^{j\times\theta} \quad (2)$$

$$\Delta p/(Cc \times Dp + Cp \times Dc + Dc \times Dp \times YL') = Roptc \times e^{-j\times\theta} \quad (3)$$

$$(Ap \times Dc + Bp \times Cc + Bp \times Dc \times YL')/(Cc \times Dp + Cp \times Dc + Dc \times Dp \times YL') - 0 \quad (4)$$

In the above, $\Delta c = Ac \times Dc - Bc \times Cc$ and $\Delta p = Ap \times Dp - Bp \times Cp$.

The series-connected load type Doherty amplifier (1) of the embodiment described above includes a carrier amplifier (14) that includes the splitter (12) connected to the input terminal (10), the combiner (22) connected to the output terminal (20), the input-side two-port network (C1) connected to one output terminal of the splitter (12), the amplifier element (C2) connected to the output terminal of the input-side two-port network (C1), and the output-side two-port network (C3) connected between the output terminal of the amplifier element (C2) and one input terminal of the combiner (22); and a peak amplifier (16) that includes the input-side two-port network (P1) connected to the other output terminal of the splitter (12), the amplifier element (P2) connected to the output terminal of the input-side two-port network (P1), and the output-side two-port network (P3) connected between the output terminal of the amplifier element (P2) and the other input terminal of the combiner (22), wherein the combiner (22) is a series-connected load type, having a series connection of the output-side two-port network (C3) of the carrier amplifier (14) and the output-side two-port network (P3) of the peak amplifier (16) for the output terminal (20) at a combining point (22), wherein the load impedance (ZL') at the output-side two-port network (C3) of the carrier amplifier (14) and the output-side two-port network (P3) of the peak amplifier (16) is a complex value.

In the Doherty amplifier (1) of the embodiment, if the load impedance at the output-side two-port network (C3) of the carrier amplifier (14) and the output-side two-port network (P3) of the peak amplifier (16) at the combining point (22) is ZL', the circuit parameters of the output-side two-port network (C3) from the current source end of the carrier amplifier (14) up until the combining point (22) are Fc (Ac, Cc, Cc, Dc), the circuit parameters of the output-side two-port network (P3) from the current source end of the peak amplifier (16) up until the combining point (22) are Fp (Ap, Bp, Cp, Dp), the load resistance of the carrier amplifier (14) in the state in which it is not backed off is Roptc, the load resistance of the peak amplifier (16) in the state in which it is not backed off is Roptp, m=1+Roptc/Roptp, and the phase difference between the phase of the current source of the carrier amplifier (14) and the phase of the current source of the peak amplifier (16) is θ, within a transmission frequency band, the following relationships (5) to (8) are satisfied.

$$(Ac \times Dp + Bc \times Cp + Ac \times Cp \times ZL')/(Cc \times Dp + Cp \times Dc + Cc \times Cp \times ZL') = m \times Roptc \quad (5)$$

$$\Delta c/(Cc \times Dp + Cp \times Dc + Cc \times Cp \times ZL') = -Roptc \times e^{j \times \theta} \quad (6)$$

$$\Delta p/(Cc \times Dp + Cp \times Dc + Cc \times Cp \times ZL') = Roptc \times e^{-j \times \theta} \quad (7)$$

$$(Ap \times Dc + Bp \times Cc + Ap \times Cc \times ZL')/(Cc \times Dp + Cp \times Dc + Cc \times Cp \times ZL') = 0 \quad (8)$$

In the above, $\Delta c = Ac \times Dc - Bc \times Cc$ and $\Delta p = Ap \times Dp - Bp \times Cp$.

An embodiment is a method for determining the circuit parameters of a parallel-connected load type Doherty amplifier (1) having a carrier amplifier (14) that has the splitter (12) connected to the input terminal (10), the combiner (18) connected to the output terminal (20), the input-side two-port network (C1) connected to one output terminal of the splitter (12), the amplifier element (C2) connected to the output terminal of the input-side two-port network (C1), and the output-side two-port network (C3) connected between the output terminal of the amplifier element (C2) and one input terminal of the combiner (18); and a peak amplifier (16) that includes the input-side two-port network (P1) connected to the other output terminal of the splitter (12), the amplifier element (P2) connected to the output terminal of the input-side two-port network (P1), and the output-side two-port network (P3) connected between the output terminal of the amplifier element (P2) and the other input terminal of the combiner (18), wherein, with the combiner (18) as the combining point and as a parallel-connected load type with the output-side two-port network (C3) of the peak amplifier (14) and the output-side two-port network (P3) of the peak amplifier (16) connected in parallel with respect to the output terminal (20), the method determines the circuit parameters of the output-side two-port network of the carrier amplifier and the output-side two-port network of the peak amplifier so that the load admittance at the combining point is a complex value.

If the load admittance at the combining point (18) is YL', the circuit parameters of the output-side two-port network (C3) from the current source end of the carrier amplifier (14) up to the combining point (18) are Fc (Ac, Bc, Cc, Dc), the circuit parameters of the output-side two-port network (C3) from the current source end of the peak amplifier (16) up to the combining point (18) are Fp (Ap, Bp, Cp, Dp), the load resistance of the carrier amplifier (14) in the state in which it is not backed off is Roptc, the load resistance of the peak amplifier (16) in the state in which it is not backed off is Roptp, m=1+Roptc/Roptp, and the phase difference between the phase of the current source of the carrier amplifier (14) and the phase of the current source of the peak amplifier (16) is θ, within a transmission frequency band, the embodiment determined the circuit parameters of the output-side two-port network of the carrier amplifier and the output-side two-port network of the peak amplifier so that the following relationships (1) to (4) are satisfied.

$$(Ac \times Dp + Bc \times Cp + Bc \times Dp \times YL')/(Cc \times Dp + Cp \times Dc + Dc \times Dp \times YL') = m \times Roptc \quad (1)$$

$$\Delta c/(Cc \times Dp + Cp \times Dc + Dc \times Dp \times YL') = -Roptc \times e^{j \times \theta} \quad (2)$$

$$\Delta p/(Cc \times Dp + Cp \times Dc + Dc \times Dp \times YL') = Roptc \times e^{-j \times \theta} \quad (3)$$

$$(Ap \times Dc + Bp \times Cc + Bp \times Dc \times YL')/(Cc \times Dp + Cp \times Dc + Dc \times Dp \times YL') = 0 \quad (4)$$

In the above, $\Delta c = Ac \times Dc - Bc \times Cc$ and $\Delta p = Ap \times Dp - Bp \times Cp$.

An embodiment is a method for determining the circuit parameters of a series-connected load type Doherty amplifier (1) having a carrier amplifier (14) that has the splitter (12) connected to the input terminal (10), the combiner (22) connected to the output terminal (20), the input-side two-port network (C1) connected to one output terminal of the splitter (12), the amplifier element (C2) connected to the output terminal of the input-side two-port network (C1), and the output-side two-port network (C3) connected between the output terminal of the amplifier element (C2) and one input terminal of the combiner (22); and a peak amplifier (16) that includes the input-side two-port network (P1) connected to the other output terminal of the splitter (12), the amplifier element (P2) connected to the output terminal of the input-side two-port network (P1), and the output-side two-port network (P3) connected between the output terminal of the amplifier element (P2) and the other input terminal of the combiner (22), wherein, the combiner (22) is a series-connected load type, having a series connection of the output-side two-port network (P3) of the carrier amplifier (14) and the output-side two-port network (P3) of the peak amplifier (16) for the output terminal (20) at a combining point (22) The load impedance at the combining point (22) is expressed using a complex number.

If the load impedance at the combining point (22) is ZL', the circuit parameters of the output-side two-port network (C3) from the current source end of the carrier amplifier (14) up until the combining point (22) are Fc (Ac, Cc, Cc, Dc), the circuit parameters of the output-side two-port network (P3) from the current source end of the peak amplifier (16) up until the combining point (22) are Fp (Ap, Bp, Cp, Dp), the load resistance of the carrier amplifier (14) in the state in which it is not backed off is Roptc, the load resistance of the peak amplifier (16) in the state in which it is not backed off is Roptp, m=1+Roptc/Roptp, and the phase difference between the phase of the current source of the carrier amplifier (14) and the phase of the current source of the peak amplifier (16) is θ, within a transmission frequency band, the method determines the circuit parameters of the output-side two-port network of the carrier amplifier and the output-side two-port network of the peak amplifier so that the relationships $$(Ac \times Dp + Bc \times Cp + Ac \times Cp \times ZL')/(Cc \times Dp + Cp \times Dc + Cc \times Cp \times ZL') = m \times Roptc \quad (5)$$

$$\Delta c/(Cc \times Dp + Cp \times Dc + Cc \times Cp \times ZL') = -Roptc \times e^{j \times \theta} \quad (6)$$

$$\Delta p/(Cc \times Dp + Cp \times Dc + Cc \times Cp \times ZL') = Roptc \times e^{-j \times \theta} \quad (7)$$

$$(Ap \times Dc + Bp \times Cc + Ap \times Cc \times ZL')/(Cc \times Dp + Cp \times Dc + Cc \times Cp \times ZL') = 0 \quad (8)$$

are satisfied, where $\Delta c = Ac \times Dc - Bc \times Cc$ and $\Delta p = Ap \times Dp - Bp \times Cp$.

According to at least one of the above-described embodiments, by expanding the load impedance from real values to complex values, it is possible to efficiently amplify a high frequency signal in the case of back-off over a broad frequency band.

While certain embodiments of the present invention have been described, these embodiments have been presented by way of example only, and are not intended to limit the scope of the inventions. Indeed, the novel embodiments described herein may be embodied in a variety of other forms, and various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for determining circuit parameters of a Doherty amplifier comprising: an input terminal; an output terminal; a splitter connected to the input terminal, the splitter having first and second outputs; a combiner connected to the output terminal, the combiner having first and second inputs; a carrier amplifier including a first input-side two-port network connected to the first output of the splitter, a first amplifier connected to an output of the first input-side two-port network, and a first output-side two-port network connected between an output of the first amplifier and the first input of the combiner; and a peak amplifier including a second input-side two-port network connected to the second output of the splitter, a second amplifier connected to the output of the second input-side two-port network, and a second output-side two-port network connected between an output of the second amplifier and the second input of the combiner, wherein the method comprises:

determining circuit parameters of the output-side two-port network of the carrier amplifier and the output-side two-port network of the peak amplifier so that the combiner is a parallel-connected load type having a parallel connection of the output-side two-port network of the carrier amplifier and the output-side two-port network of the peak amplifier for the output terminal at the combining point, and that a load admittance at the combining point is expressed using a complex number; wherein if the load admittance at the combining point is $YL'$, the circuit parameters of the output-side two-port network from the current source end of the carrier amplifier up to the combining point are Fc (Ac, Cc, Cc, Dc), the circuit parameters of the output-side two-port network from the current source end of the peak amplifier up to the combining point are Fp (Ap, Bp, Cp, Dp), the load resistance of the carrier amplifier in the state in which it is not backed off is Roptc, the load resistance of the peak amplifier in the state in which it is not backed off is Roptp, $m=1+Roptc/Roptp$, and the phase difference between the phase of the current source of the carrier amplifier and the phase of the current source of the peak amplifier is $\theta$, within a transmission frequency band, the relationships:

$$(Ac \times Dp + Bc \times Cp + Bc \times Dp \times YL')/(Cc \times Dp + Cp \times Dc + Dc \times Dp \times YL') = m \times Roptc \quad (1)$$

$$\Delta c/(Cc \times Dp + Cp \times Dc + Dc \times Dp \times YL') = -Roptc \times e^{j \times \theta} \quad (2)$$

$$\Delta p/(Cc \times Dp + Cp \times Dc + Dc \times Dp \times YL') = Roptc \times e^{-j \times \theta} \quad (3)$$

$$(Ap \times Dc + Bp \times Cc + Bp \times Dc \times YL')/(Cc \times Dp + Cp \times Dc + Dc \times Dp \times YL') = 0 \quad (4)$$

are satisfied, wherein $\Delta c = Ac \times Dc - Bc \times Cc$ and $\Delta p = Ap \times Dp - Bp \times Cp$.

* * * * *